United States Patent [19]
Spraul et al.

[11] Patent Number: 5,198,766
[45] Date of Patent: Mar. 30, 1993

[54] APPARATUS FOR MEASURING CHEMICAL AND/OR PHYSICAL REACTION SEQUENCES BY NUCLEAR MAGNETIC RESONANCE SPECTROMETRY

[75] Inventors: Manfred Spraul, Ettlingenweiler; Martin Hofmann, Rheinstetten, both of Fed. Rep. of Germany

[73] Assignee: Bruker Analytische Messtechnik GmbH, Fed. Rep. of Germany

[21] Appl. No.: 766,652

[22] Filed: Sep. 26, 1991

[30] Foreign Application Priority Data

Feb. 11, 1991 [DE] Fed. Rep. of Germany ....... 4104076

[51] Int. Cl.$^5$ ............................................. G01R 33/20
[52] U.S. Cl. ......................................... 324/300; 435/6; 427/124; 210/198.2; 210/502.1; 430/58; 556/1; 556/70; 208/107; 436/179
[58] Field of Search ............................ 324/300; 435/6; 427/124; 210/198.2, 502.1; 430/58; 556/1, 70; 208/107; 436/179

[56] References Cited

U.S. PATENT DOCUMENTS

| | | | |
|---|---|---|---|
| 4,246,537 | 1/1981 | Laukien et al. | 324/321 |
| 4,413,233 | 11/1983 | Fossel et al. | 324/300 |
| 4,576,918 | 3/1986 | Yeung | 436/179 |
| 4,587,007 | 5/1986 | Rudnick | 208/107 |
| 4,720,560 | 1/1988 | Hui et al. | 556/1 |
| 4,734,514 | 3/1988 | Melas et al. | 556/70 |
| 4,874,518 | 10/1989 | Kirkland et al. | 210/502.1 |
| 4,939,054 | 7/1990 | Hotomi et al. | 430/58 |
| 4,950,571 | 8/1990 | Hotomi et al. | 430/58 |
| 5,032,266 | 7/1991 | Kirkland et al. | 210/198.2 |
| 5,064,686 | 11/1991 | mcGeary | 427/124 |
| 5,064,754 | 11/1991 | Mills | 435/6 |

FOREIGN PATENT DOCUMENTS 2004973 2/1970 Fed. Rep. of Germany.

OTHER PUBLICATIONS

Journal of Physics E: Scientific Instruments, 1973, vol. 6, pp. 1009-1014.
Kertesz et al.: "The operational characteristics of a stoppeldflow system for ESR studies".
Rev. Sci. Instru., vol. 45, No. 1, Jan. 1974, resolution NMR spectrometer. "Application to CIDNP".
Post-dotoral thesis by K. Albert entitled "NMR Flow Spectroscopy, Contributions to its Development and Application", Chemical and Pharmaceutical Fculty of the Eberhard-Karls-University in Tübingen, 1988, pp. 75-77.

Primary Examiner—Michael J. Tokar
Attorney, Agent, or Firm—Walter A. Hackler

[57] ABSTRACT

The invention relates to an apparatus for measuring chemical and/or physical reaction sequences by nuclear magnetic resonance spectrometry and comprises a reaction path (1), a nuclear magnetic resonance spectrometer (2) and at least one reaction chamber (10) which is located in the reaction path, wherein means are provided for feeding at least the reaction product from the reaction chamber (10) to the nuclear magnetic resonance spectrometer (2). According to the invention, at least reaction chamber (10) and its reagent supply and discharge lines (5 to 7) are mounted, by means of a mounting angle (29), on the same head housing (9) on the latter's end which projects from the spectrometer magnet bore, in the stray field of the spectrometer magnet.

7 Claims, 2 Drawing Sheets

APPARATUS FOR MEASURING CHEMICAL AND/OR PHYSICAL REACTION SEQUENCES BY NUCLEAR MAGNETIC RESONANCE SPECTROMETRY

The present invention relates to an apparatus for measuring chemical and/or physical reaction sequences by nuclear magnetic resonance spectrometry (NMR), having a reaction path, an NMR-spectrometer including a spectrometer magnet and a spectrometer probe head with a spectrometer measuring cell in the bore of the magnet, a reaction chamber which is located at the beginning of the reaction path and is supplied with at least one reagent via at least one reagent supply line and means for feeding the reaction product which is formed in the reaction chamber to the measuring cell for the NMR measurement.

BACKGROUND OF THE INVENTION

An apparatus of this kind has been known from the post-doctoral thesis by K. ALBERT entitled "NMR Flow Spectroscopy, Contributions to its Development and Application", Chemical and Pharmaceutical Faculty of the Eberhard-Karls University in Tübingen, 1988, pages 75 to 77. This known measuring apparatus is used in the biomedical field for carrying out perfusion measurements on the liver of a rat. The metabolic processes are observed in an NMR flow measuring cell, using the NMR measuring method.

An NMR measuring circuit and a liver circuit are interconnected via a chamber which is designed as balancing vessel. In addition to the blood to be investigated, which is pumped from the liver of the rat into the balancing vessel using a pump, a mixture of oxygen and $CO_2$ is fed into the balancing vessel.

The known measuring permitted allowed the enzyme activity of the liver to be determined by NMR measurement.

However, it is a disadvantage of the known measuring apparatus that the path between the chamber serving as balancing vessel and the location of the NMR measurement is very long and predetermined in a fixed way. Thus, it is not possible, with the aid of the known method, to release a reaction in a reaction chamber, i.e. at a defined place, in at least one reagent in such a way that the reagent can be examined, by nuclear magnetic resonance spectrometry, continuously and yet after an individually preselectable, in particular very short, period of time after the commencement of that reaction.

It is, therefore, desirable to have the possibility to predetermine a chemical and/or physical reaction in a very defined way, as regards its location and time, and to be able in addition to examine the reaction product, by nuclear magnetic resonance spectrometry, continuously and yet after an individually preselectable, in particular a very short, period of time after the commencement of that reaction.

Further, it is desirable to subject the reaction product and/or the reagent or the reagents supplied to the reaction chamber to a long premagnetization period in the highest possible magnetic field.

This is desirable because in the case of NMR measurements transitions between nuclear energy levels split in the magnetic field are excited by an irradiated RF field. Splitting is proportional to the magnetic field strength. When in thermal equilibrium, the levels are populated according to the Boltzmann distribution law, i.e. the population difference between two nuclear energy levels is proportional to the quotient of the magnetic field strength and the temperature, it being possible to develop the exponential function of the Boltzmann distribution law, and the linear term being sufficient. Thus, the higher the magnetic field at a predetermined temperature, the greater the population difference which in its turn determines the measuring sensitivity. However, the thermal equilibrium is not established immediately, the development over time being determined by the relaxation time $T_1$ which usually is in the order of a few seconds.

Now, when a reagent flows from an area of decaying field strength (equal population) into the area of the magnetic field of the NMR spectrometer, the population difference approaches the new value of equilibrium only asymptotically at the time constant $T_1$. This leads to the result that when the relaxation times $T_1$ are relatively long and the reaction paths or reaction times are relatively short, the population difference corresponding to the field acting in the NMR measuring cell will not have been established in the latter, i.e. that measuring sensitivity will be lost. Sufficient premagnetizations can be achieved also with short preselectable reaction times. Basically, it is of no consequence in this connection if the magnetization is carried out before or after the commencement of the reaction. Of course, it is desirable that the premagnetization field be as high as possible.

Now, it is the object of the present invention to improve an apparatus of the type described above in such a way as to optimize the conditions for recording chemical and/or physical reaction sequences by nuclear magnetic resonance spectrometry, and to allow an arrangement of the reaction path which is flexible as regards the reaction conditions and favorable as regards the premagnetization time.

SUMMARY OF THE INVENTION

The apparatus which achieves the above object is characterized according to the invention, by the fact that said reaction chamber and said reaction path are arranged in the immediate vicinity of the spectrometer probe head in the magnetic field of the spectrometer magnet outside the probe head, whereby the reaction chamber is mounted in the vicinity of the spectrometer probe head end which projects from the spectrometer magnet bore and means are provided for carrying out the NMR measurement after an adjustable period of time relative to the start of a reaction in said reaction chamber and for a predetermined length of time.

The apparatus according to the invention thus enables the condition of the reaction to be recorded after a pre-determinable period of time from the commencement of the reaction by establishing a continuous flow of fresh reagents into the reaction chamber and starting the reaction in the latter at a defined point. The NMR measurement is carried out continuously, while the pre-selectable moment after the commencement of the reaction can be varied, in particular by exchanging the lines in the reaction path, and may especially be very short. Consequently, the NMR measurement may be continued for a very long time under constant conditions in the NMR measuring cell. For example it is possible, without any problems, to carry out two-dimensional NMR measurements which may take many hours.

Because the reaction chamber is mounted outside the housing of the probe head, on the latter's end projecting from the bore of the spectrometer magnet, the reagent supply and discharge lines of the reaction chamber are located in the stray field area of the spectrometer magnet, at a location where a sufficiently high field strength prevails, and is easily accessible.

According to a preferred embodiment of the invention, the reagent supply and discharge lines have variable lengths and are mounted detachably on the reaction chamber by means of a screwed fitting. The reagent supply and discharge lines communicate with a reaction space inside the reaction chamber via respective channels which are guided through the walls of the reaction chamber. A filter element arranged in the reaction space divides the reaction space into a supply-end section and a discharge-end section and ensures optimum and thorough mixing.

The filter element is, preferably, designed as a glass or ceramic filter with pores of a predetermined size. Preferably, the reaction chamber is configured in such a way that the filter element is exchangeable and the supply-side section and the discharge-side section of the reaction space are sealed off by a sealing element relative to each other and against the reaction chamber wall.

The reaction chamber is non-magnetic.

According to another advantageous embodiment of the invention, control valves are arranged in the reagent supply and reagent discharge lines in front and after the reaction chamber, at the beginning and at the end of the reaction path.

DESCRIPTION OF A BASIC MEASURING ARRANGEMENT

Figure 1:
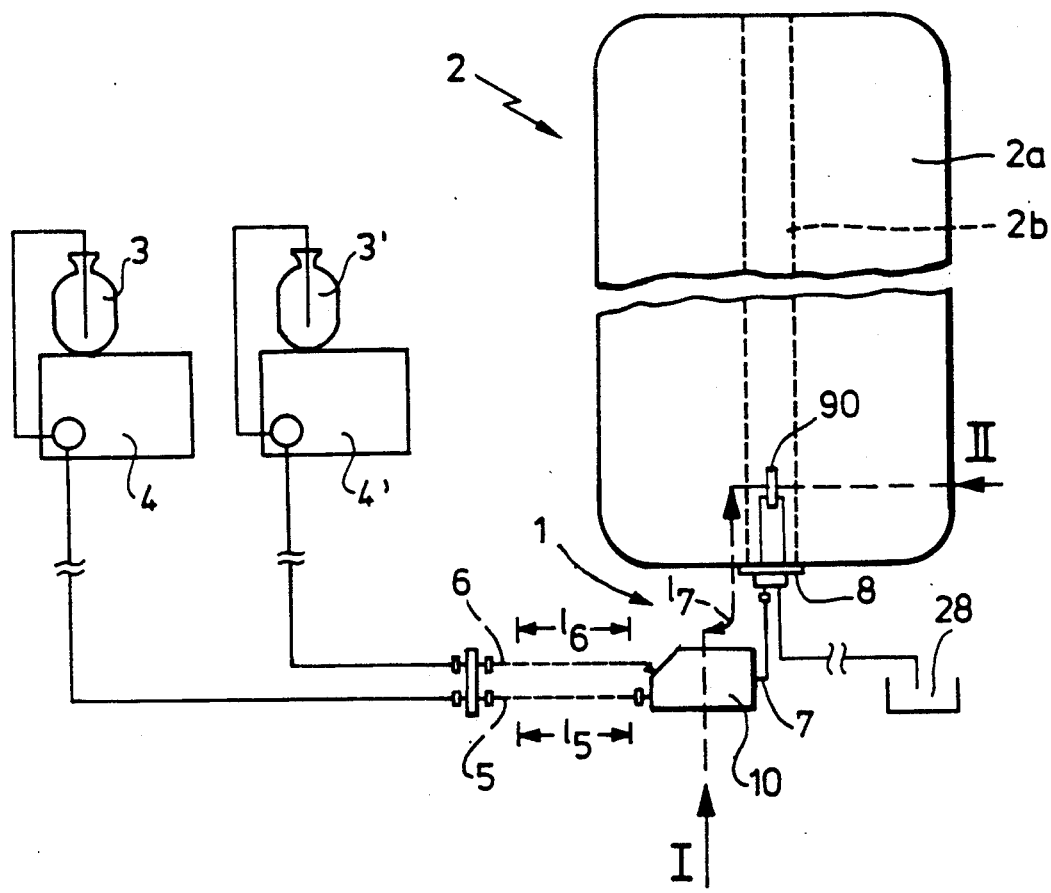
FIG. 1 shows a basic measuring arrangement according to the invention for measuring chemical and/or physical reaction sequences by nuclear magnetic resonance spectrometry.

FIG. 1 shows, in a diagrammatic way, an apparatus for measuring chemical and/or physical reaction sequences by nuclear magnetic resonance spectroscopy configured according to the invention. A reagent A and a reagent B are pumped by a first and a second pump 4 and 4', respectively, via reagent supply lines 5 and 6, into a reaction chamber 10 where the reagents A and B come to react. The reaction product is fed, via a reagent discharge line 7, to an NMR spectrometer probe head 8 within a bore 2b of a magnet 2a of an NMR spectrometer 2, where the reaction sequence and the reaction product are recorded by nuclear magnetic resonance spectroscopy in an NMR measuring cell 90.

Instead of mixing two reagents, it is also possible to influence a single reagent in the reaction chamber physically or chemically, for example by means of a temperature-control arrangement or by laser excitation.

After the reagent product has been fed through a measuring chamber inside the NMR spectrometer sample head 8, it is collected in a waste tank 28.

Generally, the duration and the development of the reaction are influenced by the arrangement of the reaction chamber 10 and of the reagent discharge line 7 in the reaction path 1 defined between the points I and II, the essential parameters including the length $l_7$, the diameter and the pressure in the reagent discharge line 7, as well as the location, size and properties of the reaction chamber 10. Further, the environmental temperature prevailing at the place of the reaction path 1 is also an important reaction condition.

It is of advantage, for measuring the reaction sequence and the reaction product by nuclear magnetic resonance spectrometry, if both the reagents A and B supplied to the reaction chamber 10 and the reaction products are premagnetized in and after the reaction chamber 10 so that, conveniently, at least part of the reaction path 1 should be arranged in the magnetic field of the NMR spectrometer magnet, especially the reaction chamber 10, the reagent discharge line 7 and, if desired, also part of the length of the supply lines 5 and 6.

DESCRIPTION OF PREFERRED EMBODIMENTS

Figure 2:
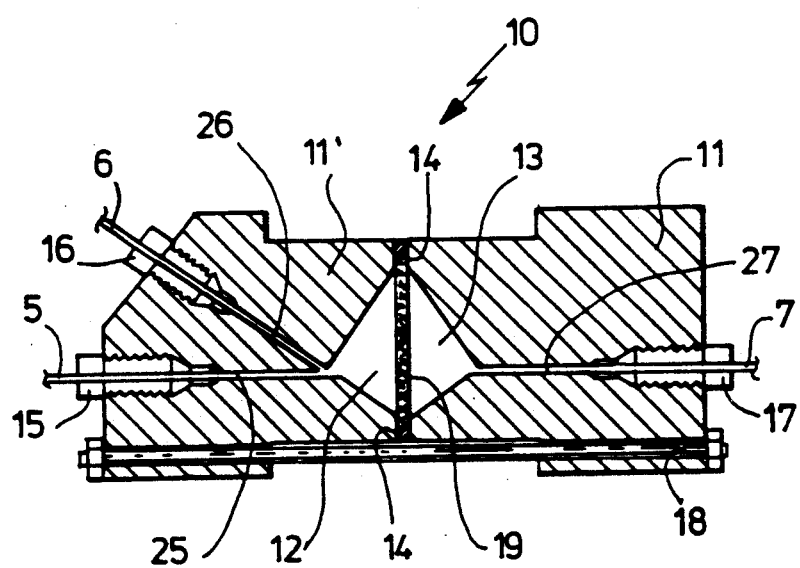
FIG. 2 shows a preferred embodiment of a reaction chamber.

The preferred embodiment of the reaction chamber 10 illustrated in FIG. 2 comprises two chamber walls 11 and 11', which are passed by supply channels 25 and 26 leading to a reaction space 12 and 13 inside the chamber walls 11 and 11'. A filter element 19 divides the reaction space 12, 13 into a supply-side section 12 and a discharge-side section 13. The filter element 19 consists, preferably, of a glass or a ceramic filter having a predetermined pore size. The material of the chamber walls 11 and 11' consists, preferably, of a non-magnetic, for example a PEEK ceramic material.

The reagent supply lines 5 and 6 are detachably connected to the reaction chamber 10 by means of HPLC fittings 15 and 16 in such a way that the inner bores of the standard fittings 15 and 16 are in alignment with the channels 25 and 26, respectively. The channels 25 and 26 open jointly into the left end of the supply-side reaction space 12. The discharge-side section 13 of the reaction space leads via a discharge channel 27 to a reagent discharge line 7, which is also detachably mounted on the reaction chamber 10 by means of a HPLC standard fitting.

In the embodiment illustrated in FIG. 2, the filter element 19 located inside the reaction space is exchangeable and sealed relative to the chamber walls 11 and 11' by a sealing element 14.

The reaction chamber 10 further consists of two wall portions 11 and 11' which are divided at their center at the location of the filter element 19. Consequently, the sealing element 14 also serves the function to seal the chamber wall portions 11 and 11' against the outside.

The two wall portions 11 and 11' are pressed together by screwed bolts 18 which, together with the sealing effect of the sealing element 14, provides the reaction space 12, 13 sealed from the outside.

Although the embodiment of the reaction chamber 10 illustrated in FIG. 2 comprises only two reagent supply lines 5 and 6, with the corresponding channels 25 and 26, and one reagent discharge line 7, in combination with the corresponding channel 27, any man skilled in the art will of course readily appreciate that more than two reagent supply lines and more than one discharge line may be provided, if this should be necessary.

The measuring space inside the measuring chamber 10 illustrated in FIG. 2 also can be adapted to the desired reaction conditions and may also have a shape different from that illustrated in FIG. 2.

Further, it is possible to equip the reaction chamber 10 with a temperature control device which enables the reaction in the reaction space 12, 13 to be carried out at a predetermined temperature. In addition, the reagent supply lines 5 and 6 and the reaction path 7 may also be temperature-controlled.

According to the invention, the reaction chamber 10 illustrated in FIG. 2, as well as its reagent supply and reagent discharge lines 5 to 7, are arranged in the direct vicinity of the spectrometer sample head 8 in the magnetic field of the spectrometer magnet.

Figure 3:
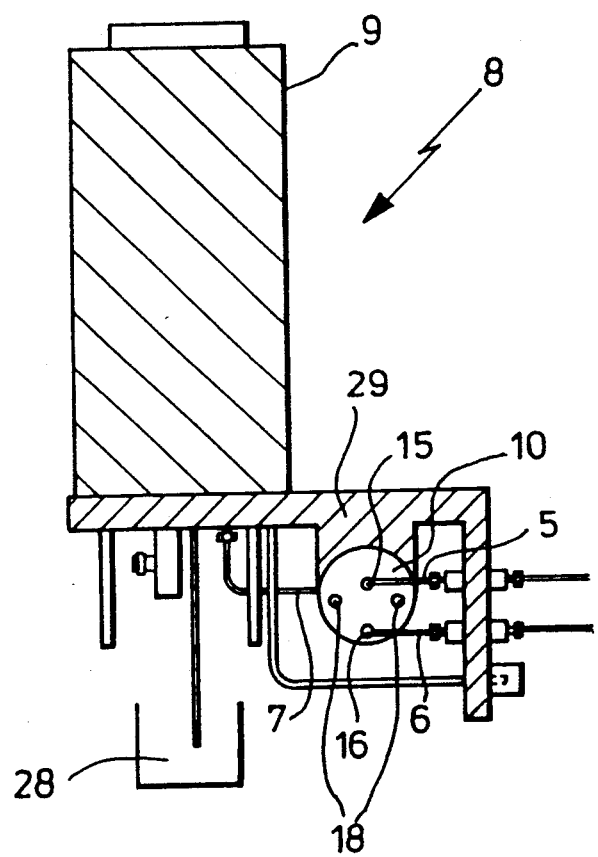
FIG. 3 shows a preferred embodiment of the apparatus according to the invention, at the location of the NMR spectrometer sample head.

FIG. 3 shows a preferred embodiment of the apparatus according to the invention, in the area of the NMR sample head. The reaction chamber 10 is mounted on the outside of the sample head housing 9, on its end projecting from the bore of the spectrometer magnet. The mounting angle 29 used for mounting the reaction chamber 10 also carries through-bushings for the reagent supply lines arriving from the pumps 4 and 4', respectively (FIG. 1).

The detachable connections between the reagent supply lines and reagent discharge lines and the reaction chamber 10, implemented by the HPLC standard fittings, enable the lengths $l_5$, $l_6$ and $l_7$ (FIG. 1) of the reagent supply and reagent discharge lines to be varied. As has been mentioned before, this variability of the lengths $l_5$, $l_6$ and $l_7$ of the supply and discharge lines 5, 6 and 7 serves for varying both the reaction time and the premagnetization time.

Due to the fact that the reaction chamber 10 is arranged in the immediate vicinity of the end of the sample head housing 9 which projects from the NMR spectrometer, there still exists at the place of the reaction chamber 10 a considerable, high field strength, a condition which is desirable for premagnetization purposes. This field strength may, for example, be in the order of 4 tesla if the magnetic field strength prevailing inside the magnet bore of the NMR magnet is 12 tesla. The material selected for the reagent supply and discharge lines 5 to 7 is, preferably, Teflon—a material which also permits a relatively large variation range for the lengths $l_5$, $l_6$ and $l_7$ of the reagent supply and discharge lines to be implemented within relatively small space, for example by the selection of a spiral design.

From FIG. 3 it is apparent that the invention is not limited to the arrangement of a single reaction chamber 10 at the location shown in the drawing. It is of course also possible to provide more than one reaction chambers, which may be connected to form a cascade circuit, for example, and may be arranged in the manner described by the invention in the immediate vicinity of the spectrometer sample head, together with their respective supply and discharge lines.

It is understood that the invention is not limited to the embodiments illustrated in the drawing. Rather, the described features of the embodiments may be implemented in other embodiments individually or in any desired combination thereof.

We claim:

1. Apparatus for measuring chemical and/or physical reaction sequences by nuclear magnetic resonance spectrometry (NMR), said apparatus comprising:
   an NMR spectrometer including a spectrometer magnet and a spectrometer probe head with a spectrometer measuring cell in a bore of the magnet;
   means, defining a reaction path, for premagnetization of reagents, said reaction path including a reaction chamber disposed adjacent said spectrometer probe head and within a magnetic field of the spectrometer magnet, said reaction chamber being supplied with at least one reagent via at least one reagent supply line and means for feeding a reaction product, which is formed in the reaction chamber, to the measuring cell for NMR measurement.

2. The apparatus according to claim 1, wherein a predeterminable length of at least one reagent supply line is disposed in the magnetic field of the spectrometer magnet in order to vary the reaction time and premagnetization time of the reagents.

3. The apparatus according to claim 1, wherein the reagent supply and/or means for feeding the reaction product to the measuring cell are mounted detachably on the reaction chamber and portions thereof located in magnetic field of the spectrometer magnet have lengths selected to vary the premagnetization time of the reagents and the reagent product.

4. The apparatus according to claim 1, wherein the reaction chamber and/or the said reagent supply and/or discharge lines further comprises means for enabling between reagents reaction to be carried out at a preselected temperature.

5. The apparatus according to claim 1, wherein the reaction chamber comprises a reaction space adapted for mixing two or more components.

6. Apparatus for measuring chemical and/or physical reaction sequences by nuclear magnetic resonance (NMR) spectrometry, said apparatus comprising:
   an NMR spectrometer including a spectrometer magnet and a spectrometer probe head with a spectrometer measuring cell;
   reaction chamber means for reacting reagent and for premagnetization of reagents, said reaction chamber being interconnected to at least one reagent supply and to said spectrometer measuring cell, said reaction chamber being disposed adjacent said spectrometer probe head and within a magnetic field of the spectrometer magnet; and
   means for varying both the reaction time and premagnetization time of the reagents.

7. The apparatus according to claim 6 wherein the means for varying both the reaction time and premagnetization time of the reagents comprises supply and discharge line means for feeding reagents to the reaction chamber means and feeding reaction product, formed in said reaction chamber means, into said spectrometer measuring cell, the length of the supply and discharge lines within the spectrometer magnetic field being selected to vary the reaction time and premagnetization time.

* * * * *